United States Patent [19]

Legat et al.

[11] 4,070,748
[45] Jan. 31, 1978

[54] INTEGRATED CIRCUIT STRUCTURE HAVING SEMICONDUCTOR RESISTANCE REGIONS

[75] Inventors: Wilhelm H. Legat, Wilmington, Mass.; Keith G. Taft, Ben Lomond; Karl H. Tiefert, Los Altos, both of Calif.

[73] Assignee: Raytheon Company, Lexington, Mass.

[21] Appl. No.: 719,201

[22] Filed: Aug. 30, 1976

Related U.S. Application Data

[63] Continuation of Ser. No. 563,429, March 31, 1975, abandoned, which is a continuation of Ser. No. 401,319, Sept. 27, 1973, abandoned, which is a continuation of Ser. No. 242,457, April 10, 1972, abandoned.

[51] Int. Cl.² ............................................. B01J 17/00
[52] U.S. Cl. .................................... 29/577 C; 29/580; 357/51
[58] Field of Search ........................ 29/577, 580, 589; 357/51

[56] References Cited

U.S. PATENT DOCUMENTS

| | | | |
|---|---|---|---|
| 3,623,218 | 11/1971 | Mitarai | 29/577 |
| 3,768,150 | 10/1973 | Sloan | 29/580 |

*Primary Examiner*—W. Tupman
*Attorney, Agent, or Firm*—Milton D. Bartlett; Joseph D. Pannone

[57] ABSTRACT

A semiconductor integrated circuit which is reduced in size by having active and/or passive elements in an epitaxial layer having a [100] crystallographic surface, and having anisotropically etched regions with sloped [111] crystallographic surface walls which isolate adjacent semiconductor elements and/or regions of semiconductor material beneath said elements. Conductors interconnecting said elements are supported on the [100] and [111] crystallographic surfaces and contact said elements and/or said high conductivity regions through apertures in surface passivating protective coatings on said surfaces.

12 Claims, 5 Drawing Figures

INTEGRATED CIRCUIT STRUCTURE HAVING SEMICONDUCTOR RESISTANCE REGIONS

CROSS REFERENCE TO RELATED APPLICATIONS

This is a continuation of application Ser. No. 563,429 filed Mar. 31, 1975, now abandoned, which is a continuation of application Ser. No. 401,319 filed Sept. 27, 1973, now abandoned, which is a continuation of application Ser. No. 242,457 filed Apr. 10, 1972 (now abandoned).

The following patent applications, which are assigned to the same assignee as this invention, are hereby made a part of this disclosure:

Application Ser. No. 141,857 filed May 10, 1971 by Karl H. Tiefert, entitled "Semiconductor Devices Manufacture" (now abandoned) and application Ser. No. 582,941 filed June 2, 1975, now U.S. Pat. No. 3,947,298 issued Mar. 30, 1976, which is a continuation of application Ser. No. 436,407 filed Jan. 25, 1974 by Karl H. Tiefert, entitled "Sputter Etched Semiconductor Structures and Method of Manufacture", now abandoned, which is a division of application Ser. No. 242,512 filed Apr. 10, 1972, entitled "Semiconductor Structures and Method of Manufacture" (now abandoned).

BACKGROUND OF THE INVENTION

Integrated circuits have, in general, been formed having coplanar surface portions of regions to which electrical interconnections are made. In such integrated circuits, isolation between the elements on the same substrate has been achieved by high temperature processes such as diffusing isolating regions of opposite conductivity type through the epitaxial layer, or by removing such regions and refilling them with insulating material such as, for example, oxides or polycrystalline semiconductor material.

Such integrated circuits have required relatively large spacing between active elements, at least partly because of such high temperature isolation processing, thereby limiting the number of active and/or passive elements which may be formed in a given size semiconductor.

The size of the semiconductor chip which is formed affects the yield of chips formed from a wafer of semiconductor material because, for example, if a wafer has 100 surface defects and is used to form only 100 chips, well over half of the chips will include a defect, but if the wafer is used to form 1000 chips, less than 10 percent of the chips will have such a defect.

In addition, such processes require many individual masking steps in which all elements of all chips on a semiconductor wafer must align with each mask within a few microns. Masks which are aligned in one portion of the wafer with respect to a previous masking operation may be out of registry in other portions of the wafer.

In addition, the distance from the metal conductors to the collector junction regions through the collector semiconductor material is relatively large when such conductors are positioned on the surface of the integrated circuit. As a result, the epitaxially grown layer used for the collector region must be made relatively low resistance, thereby reducing the collector resistance to a value below optimum for many circuit designs. In those designs where a higher collector resistance is required, an extra diffusion step is generally used to form a channel down into a high conductivity subcollector region.

SUMMARY OF THE INVENTION

This invention discloses that isolation regions may be formed with low temperature processes between active and/or passive elements on a semiconductor integrated circuit by the use of a semiconductor body having a crystal orientation which can be anisotropically etched, thereby permitting closer spacing of junctions with high reproducibility.

More specifically, a silicon wafer of P type material, having [100] crystallographic surfaces, has relatively high conductivity N type subcollectors mask diffused therein and an N type collector region, of higher resistivity than said diffused subcollector regions, epitaxially grown thereon. P and N type regions are sequentially mask diffused into said epitaxial layer and regions of said epitaxial layer anisotropically mask etched from said [100] crystallographic surface to expose portions of said subcollector regions and to isolate individual active and/or passive semiconductor elements from adjacent elements. Since such anisotropic etching, which may use sodium or potassium hydroxide or organic solutions, etches along the <100> crystallographic axis perpendicular to the epitaxial surface at a higher rate than in any other direction, very uniform etched regions may be formed with the sides of said regions forming a uniform angle with respect to the surface of the epitaxial layer of 54 to 56 degrees. Therefore, the spacing on the chip between active or passive semiconductor elements may be substantially reduced. In addition, the etched regions provide air gap isolation which reduces parasitic capacitances and increases the operating speed of the devices.

The etched regions may extend into base-to-collector junction areas of the active elements without deleterious effects upon such junctions since the walls of the etched regions lie in [111] crystallographic planes on which surface passivating coatings are formed to protect such junctions. As a result, masks for diffusion of base regions may be misaligned to a point where such regions touch the etched regions without shorting out the devices, thereby reducing production spoilage due to misregistry of masks as well as reducing the semiconductor surface areas required for such contacts.

This invention further provides for making contact, if desired, to some regions of the semiconductor elements, such as transistor collectors in anisotropically etched regions, thereby further reducing the surface area of the chip required for each semiconductor element.

Reduction in chip surface area required for each semiconductor element increases the number of semiconductor elements which may be formed on a single chip integrated circuit with substantially the same production yield as was heretofore possible with a smaller number of elements. For example, a 64 bit memory on a chip may have a production yield in the range of 10 percent to 80 percent, depending on the design layout, the quality of the chip, and the expense and care in making and other processing. Thus, since a large portion of the cost of semiconductor systems is interconnecting the elements of each integrated circuit chip with elements on other integrated circuit chips, the more elements which can be formed on a single chip with economically feasible production yields, the lower the cost per element.

In addition, because contacts may be made to semiconductor regions in any portion of the etched isolation regions, different and, in general, higher resistance epitaxially grown or diffused layers may be used, particularly for passive elements, while maintaining high conductivity paths to the portions of said regions adjacent active element junctions, thereby providing an additional reduction in size of passive elements, such as those resistors in the circuit which normally have low current drains and those having lower current drains due to the reduced size of the active elements.

BRIEF DESCRIPTION OF THE DRAWINGS

Other and further objects and advantages of the invention will become apparent as the description thereof progresses, reference being had to the accompanying drawings wherein.

DESCRIPTION OF THE PREFERRED EMBODIMENT

Figure 3:
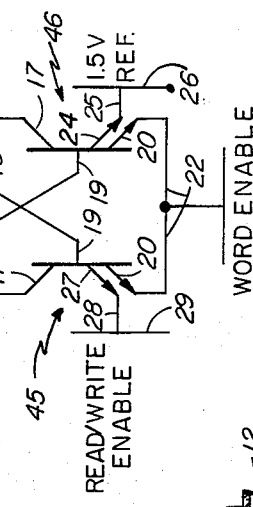
FIG. 3 illustrates a schematic diagram of the circuit of FIG. 1.
Figure 1:
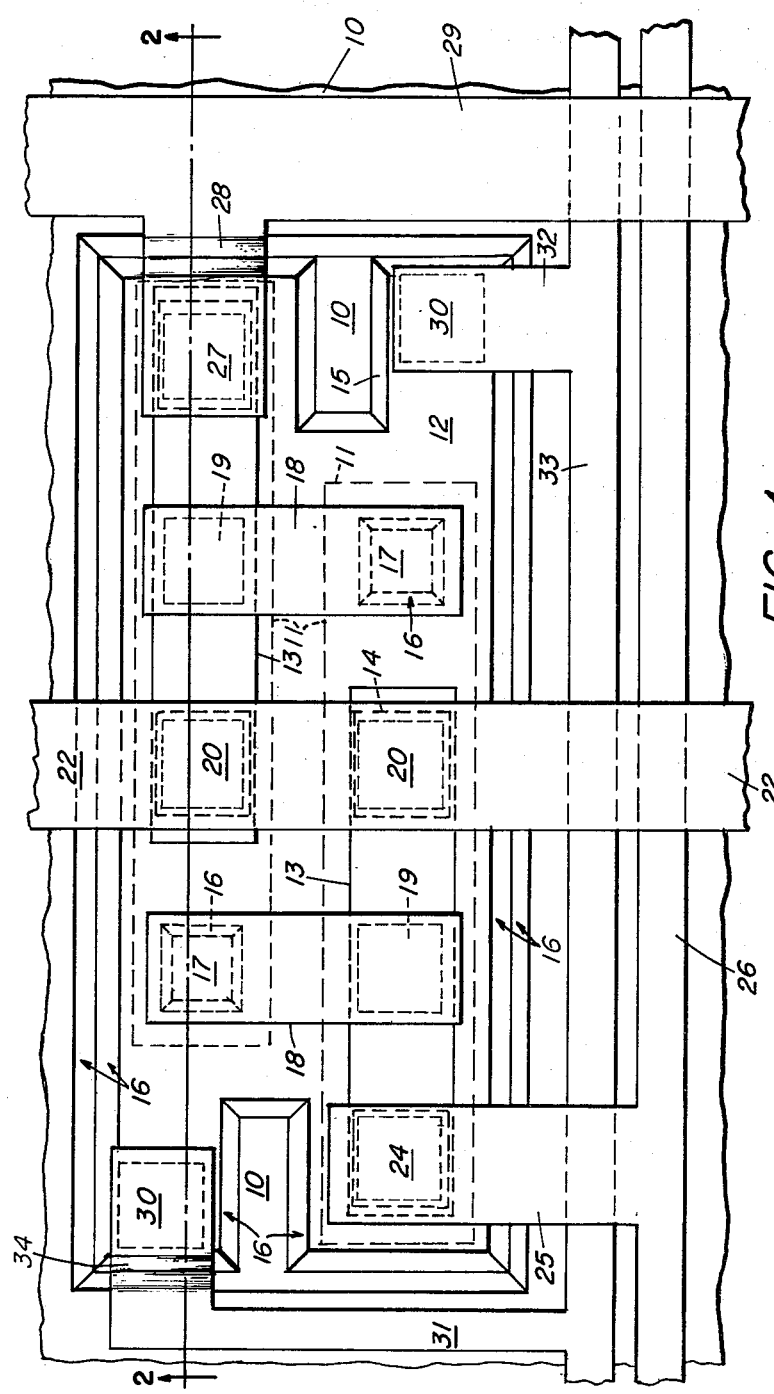
FIG. 1 illustrates a plan view of a portion of an integrated circuit device embodying the invention.
Figure 2:
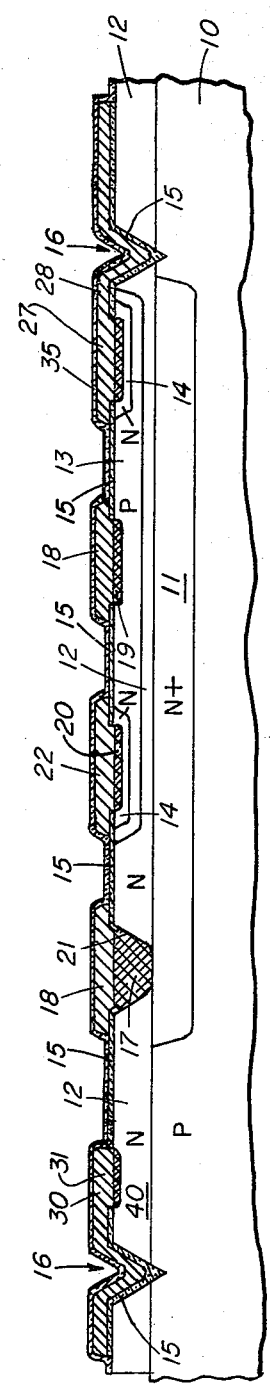
FIG. 2 illustrates a cross-sectional view of the device of FIG. 1 taken along line 2—2 of FIG. 1.

Referring now to FIGS. 1 through 3, there is shown a semiconductor body 10 which is a portion of a wafer of semiconductor material sliced from an ingot grown along the <100> axis. Preferably, body 10 is of P type material such as silicon doped with boron to a concentration greater than $10^{16}$ carriers per cubic centimeter, thereby having a bulk resistance on the order of 1 to 1½ ohm centimeters.

Diffused into body 10 are a plurality of high conductivity N+ regions 11 having a surface resistivity of, for example, 25 ohms per square centimeter. Such regions act as conductors to reduce the resistance between remote portions of the circuit and for the purposes of the circuit are regarded as substantially zero resistance conductors, such as metallic conductors. Regions 11 may be, for example 3 to 5 microns thick in accordance with well-known practice.

An N type epitaxial layer 12, 2 to 4 microns thick, covers the surface of body 10 containing the regions 11. Layer 12 preferably has a substantially higher resistance than the regions 11. For example, the impurity concentration of layer 12 may be, for example, greater than 1.5 × $10^{15}$ carriers per cubic centimeter, resulting in a bulk resistivity of 3 to 4 ohm-centimeters. While, as illustrated in FIG. 1, the regions 11 are elongated regions positioned parallel to each other and define together with the portions of region 12 lying immediately above regions 11, the collectors of a pair of transistors of a bipolar memory cell, any desired integrated circuit can be formed with this invention.

Diffused into portions of the layer 12 above portions of the regions 11 are P type base regions 13 whose depth may preferably be 1 micron and whose surface resistance may be, for example, 600 to 700 Ω/sq. cm. A plurality of N+ emitter regions 14 is diffused into each of the base regions, preferably to a depth of approximately ½ micron, and preferably having a surface resistance of 8 to 12 ohms per square centimeter.

A surface passivation and/or protection dielectric layer 15 covers the surface of the semiconductor body with apertures therethrough for making electrical connections to different regions of the semiconductor body.

Regions 16, having sloped walls lying in [111] crystallographic planes, extend from the surface of layer 12 down to, and slightly into, the substrate 10 and/or regions 11. One of the regions 16 forms a groove which surrounds the bipolar cell and prevents conduction between elements in layer 12 on one side of the groove and elements in layer 12 on the other side of the groove.

Preferably regions 16 extend from ½ to 1½ microns into the body 10 to insure that all of the conductive layer 12 has been removed, and to provide a sufficient separation between adjacent portions of layer 12 to prevent any substantial leakage between such portions through substrate 10.

Other regions 16 provide contact holes to the regions 11 so that collector contacts may be made to the regions 11 which, being of high conductivity, essentially extend the low resistance contact regions over the entire region below the portions of the layer 12 overlaying the regions 11, making these regions all essentially low resistance collector regions.

Metal straps 18 are connected between the collector contacts 17 and the base contacts 19. One of the emitters 14 of each of the transistors 45 and 46 is connected by emitter contacts 20 to a strap 22 which supplies the word enable signal to the memory cell. The other emitter 14 of transistor 46 is connected through an emitter contact 24 and a conductive strap 25 to a voltage reference bus 26, and the other emitter of transistor 45 is connected through emitter contact 27 and strap 28 to a read-write enable bus 29. The collector contacts 17 of each of the transistors are connected through the bulk epitaxial resistances 40 of the epitaxial layer 12 to contacts 30 and thence by straps 31 and 32, respectively, to a horizontal power bus 33.

The conductors have an insulating layer between them at points where they cross and are not connected. For example, the bus 22 is insulated from the buses 26 and 33 where they cross over. The two horizontal buses 26 and 33 and the two vertical buses 22 and 29 extend beyond the cell in both directions and are connected to corresponding points in adjacent cells.

Since an isolation region 16 extends completely around each cell, the active and/or passive elements in each cell are isolated from elements in adjacent cells, except through the buses.

The metallization, as shown for example by the straps 28, and the connecting strap between emitter 30 and bus 31 designated as strap 34 are supported on the sloped walls of the regions 16 where they cross such regions. This can be done since the walls of the regions 16 slope at a predetermined angle of 54° to 56° from the horizontal, and insulation and/or metallization by well-known sputtering or evaporation techniques will readily form substantially uniformly on the slopes, thereby providing continuous contact where desired in, over and/or across the grooves 16. A protective layer 35 of insulating material, such as an oxide, is deposited over the entire assembly for insulation between the layer of conductors by any desired well-known process, such as sputtering.

Resistors 40 are connected between the collectors 41 of the transistors 45 and 46 and a voltage source supplied through a voltage regulator 42 which supplies a voltage of, for example, 5.2 volts to all the cells on the same chip. Resistors 40 are made up of the bulk resistance of the portions of epitaxial layer 12 between emitter contacts 17 and the contacts 30. Their value may be adjusted by adjusting the spacing between contacts 30 and 17, preferably having a value on the order of 6,000 ohms. The resistance 43, which is adjusted by adjusting the path through the bulk resistance of the portion of region 12 lying between the collector regions of the two transistors, preferably, has a value on the order of 2,000 ohms. The resistor contacts 30 are connected by straps 28 and 34 to the supply bus 33. The bus 26 is connected to a voltage reference which may be, for example, 1.5 volts. The common emitter bus 22 is used as a word enable bus to enable data to be stored in, or read out of, the cell. The emitter strap 28 is connected to a read-write enable bus 29.

The circuit thus illustrated is a latching flip-flop transistor circuit which may be operated to store information and to read out stored information. To store information, the bus 22 is raised above 1.5 volts, causing either emitter 24 or 27 to conduct, depending upon whether the data voltage applied to emitter 27 is above or below the 1.5 volt reference on emitter 24. For example, if emitter 27 is below 1.5 volts, current will flow through the transistor 45 causing a voltage drop across the resistor 40 connected to that transistor and thereby reducing the voltage on the base 19 of transistor 46 causing it to remain cut off. When the voltage on bus 22 is lowered below the 1.5 volt reference, the transistor which is conducting continues to conduct through its emitter 20 and variation of voltage on emitter 27, which is nonconducting, will have no effect. By this process, either transistor may be caused to conduct so that one transistor indicates a logical zero by conduction, the other transistor will indicate a logical one for the memory cell.

In order to read the information stored in the cell, a conventional current sense amplifier is connected to the emitter 27 and maintains emitter 27 at substantially 1.5 volts. Bus 22 is then raised above 1.5 volts and if transistor 45 is conducting, current will flow through emitters 27 and the sense amplifier. On the other hand, if transistor 46 is conducting, no current will flow through emitter 27. This results in a nondestructive read-out of the information stored in the cell.

It should be clearly understood that the circuit illustrated herein and its layout on the semiconductor chip are by way of example only, and that any desired circuit configuration could be used.

DESCRIPTION OF THE PREFERRED PROCESS

Referring now to FIGS. 1 and 2, semiconductor body 10 is a wafer of semiconductor material sliced from an ingot grown along the <100> axis. Preferably, body 10 is of P type material such as silicon doped with a boron to a concentration greater than $10^{16}$ carriers per cubic centimeter, thereby having a bulk resistance on the order of 1 to 1½ ohms per centimeter bulk resistance.

High conductivity regions 11 of N+ type material are produced by diffusion of an N-type impurity, such as antimony, through an oxide mask having apertures formed by any well-known photoresist process. Such regions act as conductors in the finished product to reduce the resistance between remote portions of the circuit and for the purposes of the circuit are regarded as substantially zero resistance conductors. Regions 11 may be, for example, diffused to a depth of 2 to 5 microns in accordance with well-known practice.

Layer 12 is epitaxially grown on body 10 by any desired well-known practice, such as chemical vapor deposition from silicon compounds at elevated temperatures. Layer 12, preferably, is 3 to 4 microns thick and has a substantially higher resistance than the regions 11. For example, the average impurity concentration of layer 12 may be on the order of $1.5 \times 10^{15}$ carriers per cubic centimeter, resulting in an average bulk resistance of 2 to 4 ohm centimeters.

Base regions 13 are diffused into portions of the layer 12 above portions of the regions 11 to any desired depth and impurity concentration in accordance with well-known practice. For example, regions 13 may be formed by diffusion of any desired P type impurity, such as phosphorous, through an apertured oxide mask to a depth preferably of approximately 1 micron.

Isolation regions 16 are formed by preferentially etching through the epitaxial layer 12 and slightly into the substrate 10 to insure that there be no conduction between the portions of layer 12 inside the groove from those in adjacent regions on the outside of the groove. The preferential, or anisotropic etching, of the semiconductor material is done through a mask using any desired isotropic etch, such as a solution of sodium hydroxide, potassium hydroxide, or various organic solutions which etch silicon substantially faster along the <100> crystallographic axis than in any other direction. The mask is preferably formed by oxidizing the surface of the semiconductor material to a depth of, for example, 4,000 to 5,000 Angstroms by heating in an oxidizing atmosphere, in accordance with well-known practice, forming a photoresist mask on the oxide surface, dissolving portions of the oxide layer exposed through the photoresist mask, in accordance with well-known practice, with a buffered hydrogen fluoride solution and dissolving the photoresist mask to leave portions of the oxide layer which act as a mask through which the anisotropic etching solution is applied.

Since the anisotropic etch proceeds in silicon in a direction perpendicular to the [100] crystallographic surface at a rate faster than in any other direction, and forms sloped walls lying substantially in [111] crystallographic planes and having an angle of approximately 54° to 56° with respect to said [100] crystallographic surface, the contours of the etched regions may be predicted very precisely from the shape of the apertures in the oxide mask and the depth of the etch may be controlled within a few percent by maintaining the etching process at a uniform temperature and solution concentration and adjusting the duration of the etching process. The mask apertures preferably are rectilinear, having their sides positioned along the <110> crystallographic axis of the body 10.

Isolation regions 16 are preferably etched to reach an apex so that etching substantially ceases since it proceeds at a much slower rate when the apex is reached and substantial further penetration into the body 10 will not occur, even if the etching process continues for a substantial additional period of time. The etch time can then be set by the depth to which these regions 16 expose the subcollectors 11 for connection of the collector contacts 17.

The oxide mask, used for anisotropic etching, is removed by a buffered hydrogen fluoride solution and the entire surface is coated with a new dielectric layer 15. Layer 15 is preferably laminated by forming a thermally grown silicon dioxide layer 200 to 600 Angstroms thick for surface junction passivation, a silicon nitride approximately 1,000 to 2,000 Angstroms thick for protecting the oxide layer from contamination, and an oxide layer 5,000 to 10,000 Angstroms thick to space conductors from the surface body 10 and thereby reduce interelectrode capacitances. The layers are preferably formed by chemical vapor deposition, in accordance with well-known practice.

Regions on layer 15 through which contacts are to be made to the semiconductor body are now exposed through a photoresist mask formed on layer 15 and the exposed regions are etched with a buffered hydrogen fluoride solution, thereby exposing the silicon nitride layer. The regions where contact is to be made to P impurity regions of the semiconductor, such as the bases 19, are covered with a second layer of photoresist which need not be particularly accurate since the underlying photoresist defines the areas in the oxide layer 17 and, accordingly, all that is necessary is that the second mask not have openings in the regions 19.

The exposed silicon nitride layer 16 is removed in the regions overlying the emitter and collector portions of the semiconductor elements by etching with a solution of phosphoric acid, in accordance with well-known practice, and the exposed oxide layer is then removed by a hydrogen fluoride solution. All photoresist layers are then stripped off.

The exposed silicon regions have N+ emitter junction regions 14 or collector contact regions 17 formed therein by subjecting the chip to a diffusion process at elevated temperature in an atmosphere of, for example, P type material such as a phosphorus compound in an oxidizing atmosphere, in accordance with well-known practice. Ohmic collector contact regions 17 and junction emitter regions 14, preferably, have a surface resistance on the order of 10 to 15 ohms per $cm^2$. A layer of oxide approximately several hundred Angstroms thick grows over the exposed surfaces of the emitter and collector regions due to the use of an oxidizing atmosphere during the diffusion process.

The silicon nitride layer over the base regions 19 and resistor contact regions 13 is then removed by etching with a solution of phosphoric acid, in accordance with well-known practice, which also removes a few hundred Angstroms of the oxide layer over the emitter and collector regions.

The remaining oxide over all the contact areas is then removed by any desired means and preferably is removed by sputter washing in accordance with the aforementioned application Ser. No. 582,941, now U.S. Pat. No. 3,947,298. A coating of contact metal, such as platinum, is deposited by any desired means, such as vacuum deposition or sputtering, on the contact areas. The chip may, if desired, be heated to convert at least portions of the metal layer in contact with the silicon into a silicide of the metal and the excess metal removed by etching with aqua regia.

A multilayer contact region is now deposited to interconnect elements 24 of the circuit on the chip. Such multilayer may be, for example, the titanium-platinum-gold layer specifically referred to in the aforementioned patent application Ser. No. 582,941, now U.S. Pat. No. 3,947,298.

Alternatively, multilayer interconnect system comprising aluminum or any other desired system of metals for interconnect purposes may be used.

Since the isolating regions 16 have a slope of approximately 53° to 56°, such metallurgical interconnecting leads, when laid down by sputtering, vapor deposition or otherwise, will deposit relatively uniformly on the sloped regions as well as on the flat surface regions, thereby facilitating fabrication of the complete unit.

Figures 4, 5:
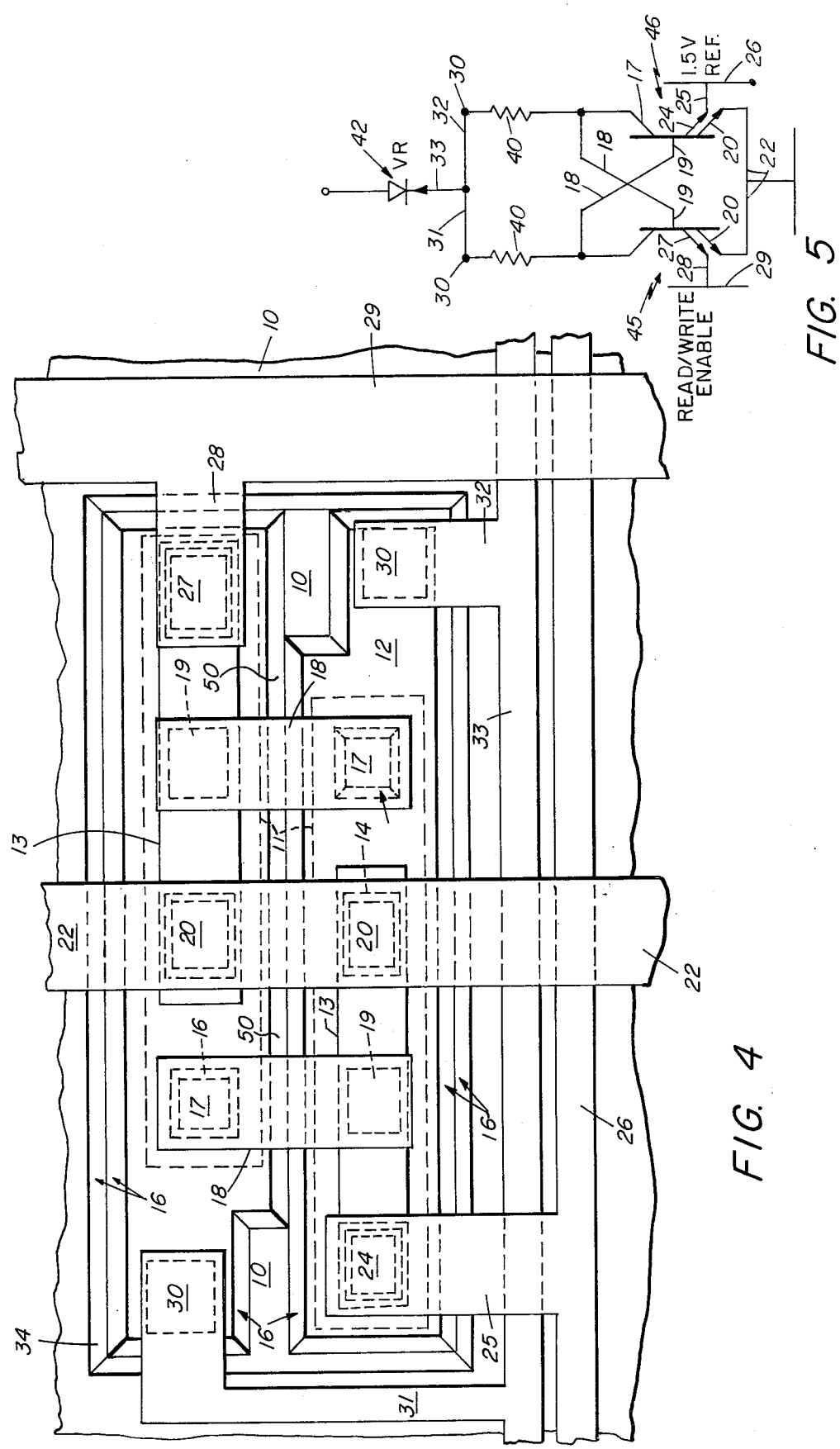
FIG. 4 illustrates a plan view of an alternate embodiment of the invention.
FIG. 5 illustrates a schematic diagram of the circuit of FIG. 4.

Referring now to FIGS. 4 and 5, there is shown an alternative design of the structure of FIGS. 1 and 2 in which an extension 50 of the etched regions 16 isolates the transistors within each cell from each other, thereby eliminating the resistance 43 of FIG. 3 and resulting in the circuit shown in FIG. 5.

As may be seen, the groove 50 comprises a preferentially etched portion of the region 16 in which all epitaxial layer 12 has been removed down to, and slightly into, substrate 10, thereby isolating the transistors 45 and 46.

From the foregoing, it may be seen that semiconductor integrated circuit structures may have interconnections for the circuit elements built up with one interconnecting layer separated from another by insulating material and the spacing between the elements reduced to a minimum by the use of preferentially etched moats having sloped walls which can support the interconnecting layers. In addition, it should be noted that the busbars may be formed in the moat regions, thereby taking advantage of the natural isolation in these regions to further reduce the total surface space required on the chips. It should be understood, however, that any desired regions on the top surface can be used to support the various leads. Also, the sloped wall isolation of this invention may, if desired, be combined with other types of isolation, such as diffusion isolation or oxidation isolation.

This completes the description of the particular embodiment of the invention illustrated herein, however, many modifications thereof will be apparent to persons skilled in the art without departing from the spirit and scope of the invention. For example, capacitors, inductors and other electrical elements may be formed in a semiconductor substrate in accordance with the teaching of this invention and any desired circuit can be laid out using these principles. In addition, metal, oxide, silicon structures for field effect devices may be made with this invention. Accordingly, it is contemplated the scope of this invention be not limited to the particular details of the embodiment illustrated herein except as defined by the appended claims.

What is claimed is:

1. The method of forming an integrated circuit comprising the steps of:

forming a semiconducting layer having a <100> crystallographic surface on a supporting substrate comprising epitaxially depositing said layer over said substrate;

forming in said layer a plurality of active elements with said elements having a plurality of emitter regions formed in common base regions, base contacts formed on said base regions intermediate said emitter regions, and resistive regions comprising portions of said epitaxial layer directly connected to collector regions, said collector regions forming collector junctions with said base regions, portions of the boundaries of said resistive regions being formed by etching said layer from said <100> crystallographic surface along <111> crystallographic surface planes at least through said layer; and forming conductors which are supported on insulating layers on said <100> and <111> surfaces of said layer and which interconnect regions of at least some of said elements.

2. The method in accordance with claim 1 wherein said step of forming said layer on said substrate comprises forming said substrate of a semiconductor comprising a first conductivity type and forming said layer of a second conductivity type.

3. The method in accordance with claim 2 wherein said layer is epitaxially formed on said substrate by chemical vapor decomposition at an elevated temperature.

4. The method in accordance with claim 3 wherein said step of forming said elements comprises diffusing base regions of said first conductivity type into said epitaxial layer.

5. The method in accordance with claim 4 wherein said step of forming said elements comprises forming emitter junctions with said base regions and removing semiconductor material from regions spaced from said emitter junction regions between said elements by anisotropically etching said layer.

6. The method in accordance with claim 5 wherein emitter junction regions are diffused into said diffused region after said anisotropic etching.

7. The method of forming an integrated circuit comprising the steps of:
  forming a semiconducting layer having a <100> crystallographic surface on a supporting substrate comprising epitaxially depositing said layer over said substrate;
  forming in said layer a plurality of active elements with said elements having a plurality of emitter regions formed in common base regions, base contacts formed on said base regions intermediate said emitter regions, and resistive regions comprising portions of said epitaxial layer directly connected to collector regions, said collector regions forming collector junctions with said base regions, portions of the boundaries of said resistive regions being formed by etching said layer from said <100> crystallographic surface along <111> crystallographic surface planes; and
  forming conductors which are supported on insulating layers on said <100> and <111> surfaces of said layer and which interconnect regions of at least some of said elements.

8. The method in accordance with claim 7 wherein said step of forming said layer on said substrate comprises forming said substrate of a semiconductor comprising a first conductivity type and forming said layer of a second conductivity type.

9. The method in accordance with claim 8 wherein said layer is epitaxially formed on said substrate by chemical vapor decomposition at an elevated temperature.

10. The method in accordance with claim 9 wherein said step of forming said elements comprises diffusing base regions of said first conductivity type into said epitaxial layer.

11. The method in accordance with claim 10 wherein said step of forming said elements comprises forming emitter junctions with said base regions and removing semiconductor material from regions spaced from said emitter junction regions between said elements by anisotropically etching said layer.

12. The method in accordance with claim 11 wherein emitter junction regions are diffused into said diffused region after said anisotropic etching.

* * * * *